(12) United States Patent
Masleid (10) Patent No.: US 8,946,905 B2
(45) Date of Patent: Feb. 3, 2015

(54) VIA STRUCTURE FOR INTEGRATED CIRCUITS

(75) Inventor: Robert P. Masleid, Monte Sereno, CA (US)

(73) Assignee: Oracle International Corporation, Redwood Shores, CA (US)

( * ) Notice: Subject to any disclaimer, the term of this patent is extended or adjusted under 35 U.S.C. 154(b) by 635 days.

(21) Appl. No.: 13/169,255

(22) Filed: Jun. 27, 2011

(65) Prior Publication Data

US 2012/0326327 A1 Dec. 27, 2012

(51) Int. Cl.
*H01L 23/528* (2006.01)
*H01L 23/522* (2006.01)

(52) U.S. Cl.
CPC .......... *H01L 23/5226* (2013.01); *H01L 23/528* (2013.01); *H01L 23/5283* (2013.01)
USPC ............. 257/774; 257/E23.151; 257/E23.175

(58) Field of Classification Search
None
See application file for complete search history.

(56) References Cited

U.S. PATENT DOCUMENTS

| 4,682,323 A | 7/1987 | Corfield |
| 2007/0170574 A1 | 7/2007 | Lauxtermann |
| 2009/0005872 A1 | 1/2009 | Moumene |
| 2010/0270684 A1* | 10/2010 | Check et al. ................. 257/774 |

* cited by examiner

*Primary Examiner* — Julio J Maldonado
*Assistant Examiner* — Mohammad Choudhry
(74) *Attorney, Agent, or Firm* — Meyertons Hood Kivlin Kowert & Goetzel; Erik A. Heter (57) ABSTRACT

An integrated circuit (IC) having a concentric arrangement of stacked vias is disclosed. The IC includes first and second pluralities of signal lines on first and second metal layers, respectively. The second metal layer is arranged between the first metal layer and a silicon layer. The IC also includes a via structure implemented in a predefined area, and connects each of the first and second pluralities of signal lines to circuitry in the silicon layer through respective first and second pluralities of vias. Each via of the first and second pluralities has a center point that extends along a vertical axis from its respective metal layer to the silicon layer. Centers of each of the second plurality of vias are closer to a perimeter of the predefined area than respective centers of any of the first plurality of vias.

17 Claims, 7 Drawing Sheets

VIA STRUCTURE FOR INTEGRATED CIRCUITS

BACKGROUND

1. Field of the Invention

This invention relates to integrated circuits (ICs), and more particularly, to vias used to facilitate connections between circuits in an IC.

2. Description of the Related Art

Modern very large scale integrated (VLSI) circuits often times include on-chip networks with large and complex wiring systems. For example, many modern processor include a multiple processor cores, multiple caches, various interface units, and so on. Such processors may implement an on-die network to enable these various agents to communicate with one another. In some cases, the on-die network may implement one or more crossbar circuits to connect various agents to each other. Crossbar circuits may implement a large number of switchable connections. These connections may be concentrated in a small area of the IC. Furthermore, the connections may traverse multiple dimensions. For example, the connections may traverse both x and y axes in direction, but may also traverse a z-axis through the metal layers, since some connections may be implemented on different metal layers than others. The connections traversing the z-axis may connect the transistors in the silicon layer to wires on the various metal layers.

Various techniques may be employed to handle the high number of connections that may be concentrated in small areas with crossbars and other types of circuitry in an IC having large, on-die networks. For example, in connecting a wire from an upper metal layer to a transistor in the silicon layer, a via may be implemented that traverses some (but not all) of the metal layers, with another horizontal signal connection, and another via that completes the connection to the silicon layer. Wires from upper metal layers may also include bends or other directional changes so that they can avoid other wires and other vias to make a connection with the silicon layer.

SUMMARY OF THE DISCLOSURE

An integrated circuit (IC) having a concentric arrangement of stacked vias is disclosed. In one embodiment, the IC includes first and second pluralities of signal lines on first and second metal layers, respectively. The second metal layer is arranged between the first metal layer and a silicon layer. The IC also includes a via structure implemented in a predefined area, and connects each of the first and second pluralities of signal lines to circuitry in the silicon layer through respective first and second pluralities of vias. Each via of the first and second pluralities has a center point that extends along a vertical axis from its respective metal layer to the silicon layer. Centers of each of the second plurality of vias are closer to a perimeter of the predefined area than respective centers of any of the first plurality of vias.

In one embodiment, a method for fabricating an IC includes forming circuitry on a silicon layer. Metal layers may be formed above the silicon layer, including a lower metal layer having a first plurality signal lines implemented thereon. The method further includes forming a via structure having a predefined area. Each of a first plurality of vias may couple corresponding ones of the first plurality of signal lines to circuitry implemented in the silicon layer. Respective centers of each of the first plurality of vias may extend along a vertical axis between the lower metal layer and the silicon layer. An upper metal layer may be formed above the lower metal layer, and may have a second plurality of signal lines implemented thereon. Each of a second plurality of vias may couple corresponding ones of the second plurality of signal lines to circuitry in the silicon layer. Respective centers of each of the second plurality of vias may extend along the vertical axis between the upper metal layer and the silicon layer. The respective centers of each of the first plurality of vias are arranged to be closer to the perimeter of the predefined area than respective centers of any of the second plurality of vias.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Overview

The present disclosure is directed toward a via structure implemented in a predefined area an integrated circuit (IC). Multiple instances of the via structure may be implemented, with each via structure implemented in its own predefined area. The via structure may include a number of vias that may connect signal lines (wires) implemented on various metal layers of the IC to circuitry (e.g., transistors) implemented in the silicon layer. Each of the vias may be effectively implemented as a straight line between its respective signal line and the circuitry of the silicon layer. That is, each via includes a centerline that extends the full distance from the respective metal layer of the corresponding signal line down to the silicon layer, with no bends, jogs, or other discontinuities.

The arrangement of the vias along the axes parallel to a top surface of the IC (e.g., x-axis and y-axis) may be determined by the respective metal layers of the signal lines to which they are coupled. In general, vias associated with signal lines on higher metal layers may be closer to the center of the via structure. Vias associated with lower metal layers may be closer to the perimeter of the predefined area of the via structure. As used herein, the term "higher" when applied to metal layers may be defined as those metal layers that are closer to the top of the layer stack up of the IC, and thus further from the silicon layer. The term "lower" when applied to metal layers may be defined as those metal layers that are closer to the silicon layer, and further, that are arranged between the silicon layer and the higher metal layers. For example, if an IC has eleven metal layers labeled, from lowest to highest M0-M10, layer M0 is the lowest metal layer and that which is closest to the silicon layer. Layer M10 in this example is the highest metal layer and that which is furthest from the silicon layer. Layers M9 and M8 may be considered higher metal layers under this definition, with layer M9 being higher than layer M8. Similarly, layers M1 and M2 may be considered lower metal layers, with M1 being lower than M2 by the definition used herein. The distinction between higher (or upper) metal layers and lower metal layers is illustrated by way of example in the drawings and will be discussed in further detail below.

Implementation of the via structure in the manner discussed herein may enable long-distance signal lines to be implemented as straight lines. That is, at least some, if not all of the long-distance signal lines may be implemented with no bends, jogs, zigzags, or other alterations to the signal path. Accordingly, long-distance signal lines may be implemented on higher metal layers of the IC as straight, point-to-point signal paths between two vias. Signals traveling in one of the long-distance signal paths between two vias may travel along a single axis on a horizontal plane with no variation in direction. Furthermore, the concentric arrangement of vias according to the height in the stack of the metal layers upon which corresponding signal lines are implemented may allow the vias to make drop straight down to the silicon layer from the metal layer with no bends, jogs, or other alterations therebetween. Accordingly, signals traveling between a signal line and the silicon layer may travel along the vertical axis that extends perpendicularly with respect to the horizontal plane. This arrangement may allow for a more efficient layout of the IC geometry, and may result in the minimization of resistance and capacitance of long-distance signal paths, thereby improving electrical performance of the IC. Examples of specific embodiments will now be discussed in further detail below.

IC Having On-Die Network

Figure 1:
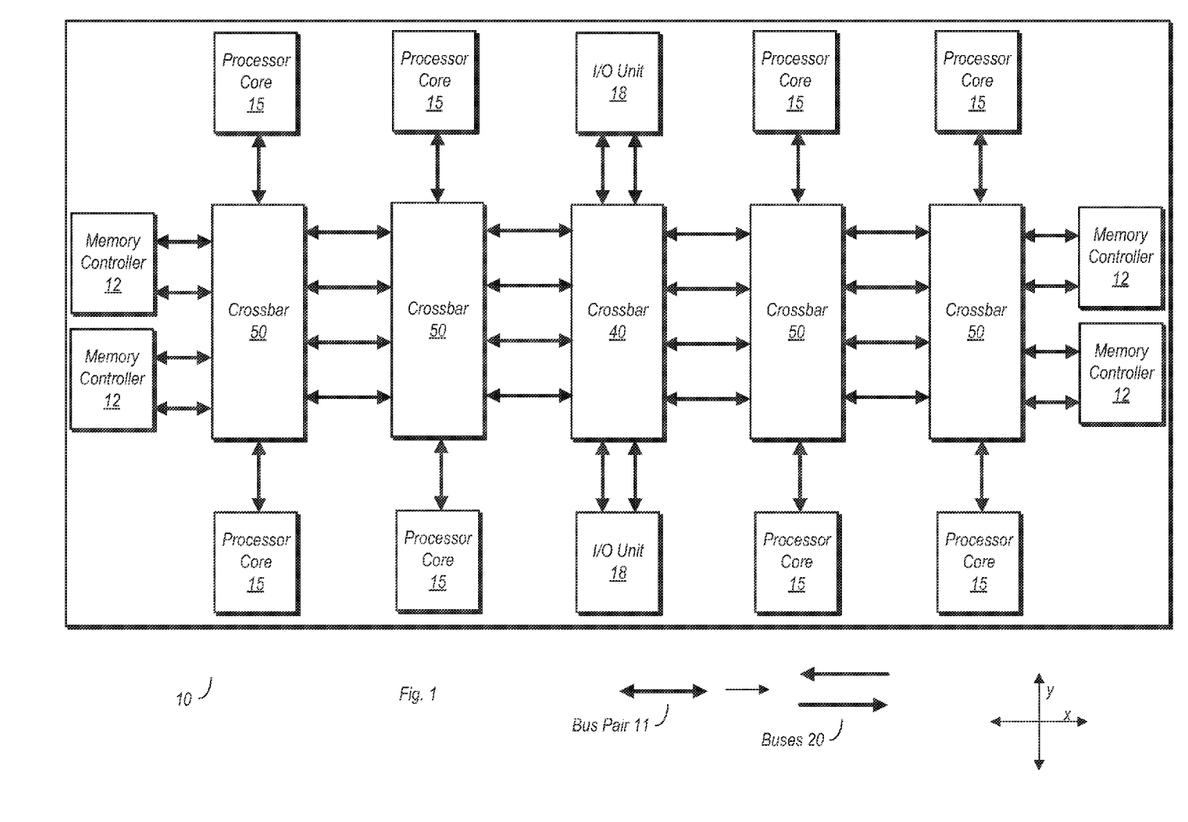
FIG. 1 is a block diagram of one embodiment of an integrated circuit (IC) having an on-die data network.

Turning now to FIG. 1, a block diagram of one embodiment of an IC having an on-die data network is illustrated. In the embodiment shown, IC 10 includes four memory controllers 12, eight processor cores 15, and two input/output (I/O) units 18. Each of these various agents may be coupled to any one of the others of IC 10 through an on-die data network that includes crossbar unit 40, four instances of crossbar unit 50, and a number of unidirectional buses depicted here as bus pairs 11.

Each bus pair 11, represented here by the bidirectional arrows, includes two physically separate unidirectional buses 20. Each bus 20 of a given bus pair 11 is arranged (through coupling of transmitters and receivers) to convey signals in one direction only. Furthermore, counterpart buses 20 of each bus pair 11 are arranged to convey signals in the opposite direction.

In the embodiment shown, a given bus 20 of a bus pair 11 may convey signals along one of two different axes, the x-axis or y-axis, which are perpendicular with respect to each other. Moreover, the signal lines that make up any one of buses 20 in this disclosure are implemented as straight lines between any two vias, as will be discussed in further detail below. For the purposes of this disclosure, the signal lines that make up the various buses 20 are designated as long-distance signal lines, and may be implemented on one of the upper metal layers of the IC. Long-distance signal lines may be implemented as straight lines, extending along a single axis in their entirety (i.e. with no bends or turns) between vias that couple them to circuitry implemented in a silicon layer. In contrast, local, short-distance wires (such as those within a crossbar unit 40 or 50) may be implemented on the lower metal layers and may have bends, turns, and other changes and may extend along more than one axis.

Crossbar unit 40 in the embodiment shown is a 12×12 crossbar unit. That is, crossbar unit 40 in the embodiment shown is coupled to receive inputs from 12 unique instances of buses 20, and is further coupled to provide outputs to 12 unique instances of buses 20. Crossbar units 50 are each 10×10 crossbar units, each coupled to 10 incoming buses and 10 outgoing buses. Each of crossbar units 40 and 50 is configured to couple one of its incoming buses to one of its outgoing buses in order to facilitate communications between a given pair of agents of IC 10. Although not explicitly shown here for the sake of simplicity, each of crossbar units 40 and 50 may be coupled to receive select signals to enable the coupling of a selected incoming bus to a selected outgoing bus.

Since each of the buses 20 is N bits wide in the illustrated embodiment, each of crossbar units 40 and 50 include N crossbar circuits, one for each bit. The crossbar circuits, which will be discussed in further detail below, are each configured to couple signal lines of an incoming and outgoing bus, with the coupled signal lines being arranged to convey bits of equal significance. For example, a given crossbar circuit may couple a bit 0 signal line of an incoming bus to a bit 0 signal line of an outgoing bus. The circuits of each of crossbar units 40 and 50 may be coupled by local wiring implemented at high density on one of the lower metal layers (i.e. nearer to the silicon layer) using thin wiring. As noted above, the local wiring within a crossbar (as well as within the other functional units shown) may include bends and turns as necessary to accommodate the necessary local interconnections.

The signal lines of each of the buses may be physically arranged to efficiently utilize area on the die of IC 10, while also providing for better electrical signal transmission characteristics. As noted above, each long-distance signal line may be implemented as a straight line that extends along a single axis only. In this particular embodiment, a long-distance signal line may extend along either the x-axis or the y-axis, but not both, or any axis therebetween. Accordingly, long-distance signal lines as discussed herein are implemented without bends, turns, or other deviations from its respective axis at any point between vias used to couple the signal lines to circuitry in the silicon layer.

Figure 2:
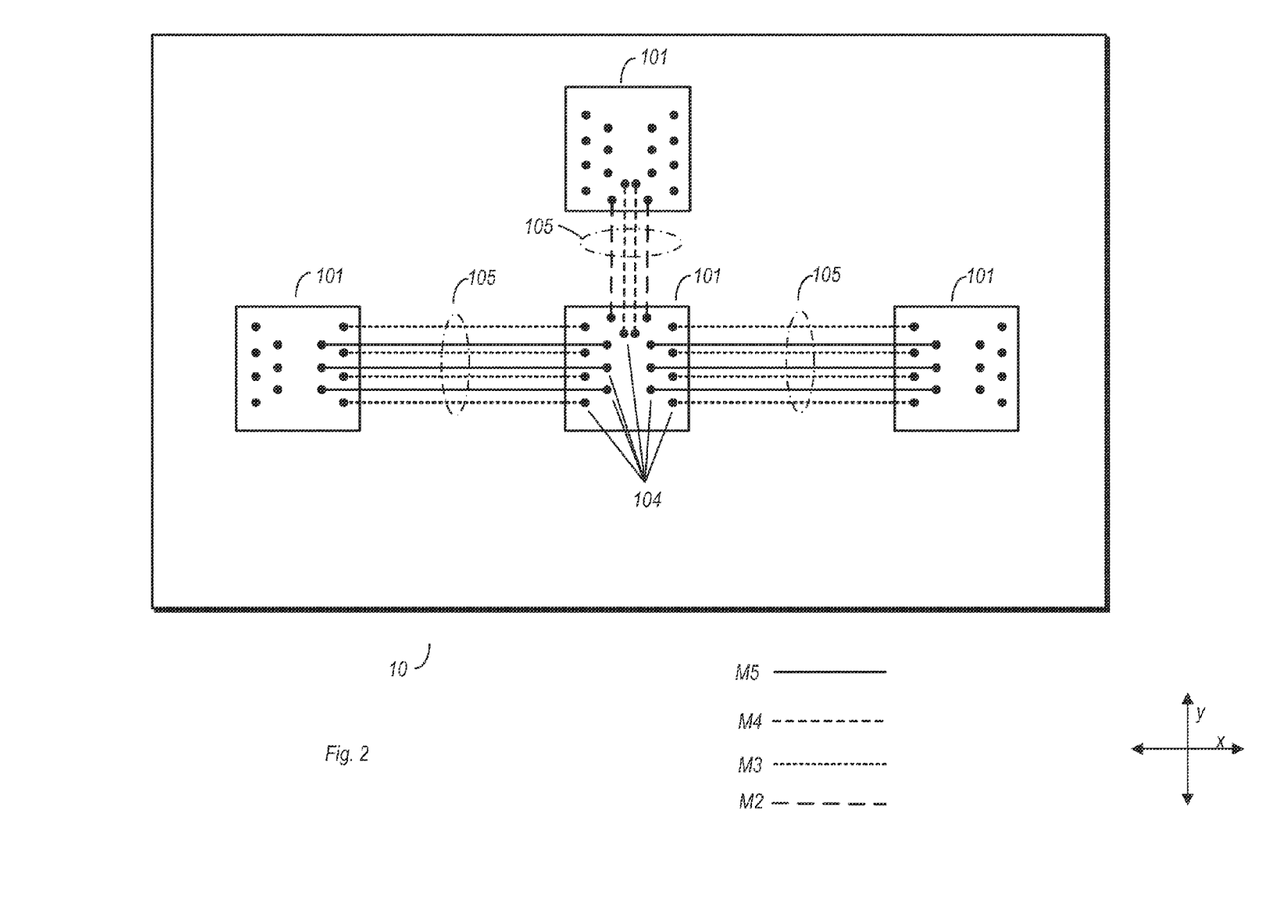
FIG. 2 is a top view of one embodiment of an IC illustrating an arrangement of via structures.

An alternate top-down view of IC 10 is shown in FIG. 2. More particularly, FIG. 2 is a top view of one embodiment of IC 10 illustrating an exemplary arrangement of via structures. In the embodiment shown, IC 10 includes a number of via structures 101. Each via structure 101 includes a number of vias 104 that electrically and physically couple a signal line 105 to circuitry (e.g., transistors) in the silicon layer of IC 10. It is noted that signal lines 105 are long-distance signal lines in this example. The long-distance signal lines 105 shown here may be considered examples of the signal lines used to implement the various buses 20 discussed above with reference to FIG. 1.

In the embodiment shown, various signal lines 105 may be implemented on different metal layers from others, as illustrated by the various line patterns associated with each. In this particular example, some signal lines extending along the x-axis in this example are implemented on metal layers M5 and M3. Signal lines 105 extending along the y-axis in this example are implemented on metal layers M4 and M2.

As will be discussed in further detail below, vias 104 associated with signal lines 105 implemented on higher metal layers (e.g., M5 and M4 in this example) are arranged closer to the center of each via structure 101. Vias 104 associated with signal lines that are implemented on metal layers M3 and M2 in this example (which are lower in the metal stack-up than M5 and M4) are closer to the perimeter of each via structure 101. The perimeter of each via structure 101 may define a designated area in which vias 104 extending from the metal layers containing long-distance signal lines 105 to circuitry in the silicon layer may be implemented. In general, the lower the metal layer of the associated signal line 105, the further out toward the perimeter an associated via 104 is placed. The higher the metal layer of the associated signal line 105, the closer toward the center and associated 104 is placed.

It is noted that the embodiment shown in FIG. 2 is exemplary, and thus embodiments wherein the long-distance signal lines 105 are implemented on other layers than those explicitly discussed here are possible and contemplated. Furthermore, while via structures 101 are implemented here in an embodiment wherein the long-distance signal lines are implemented as straight lines, embodiments wherein the via structures 101 are implemented on ICs wherein at least one of the long-distance signal lines is not a straight line in its entirety are possible and contemplated.

IC Layer Stack and Via Positioning

Figure 3:
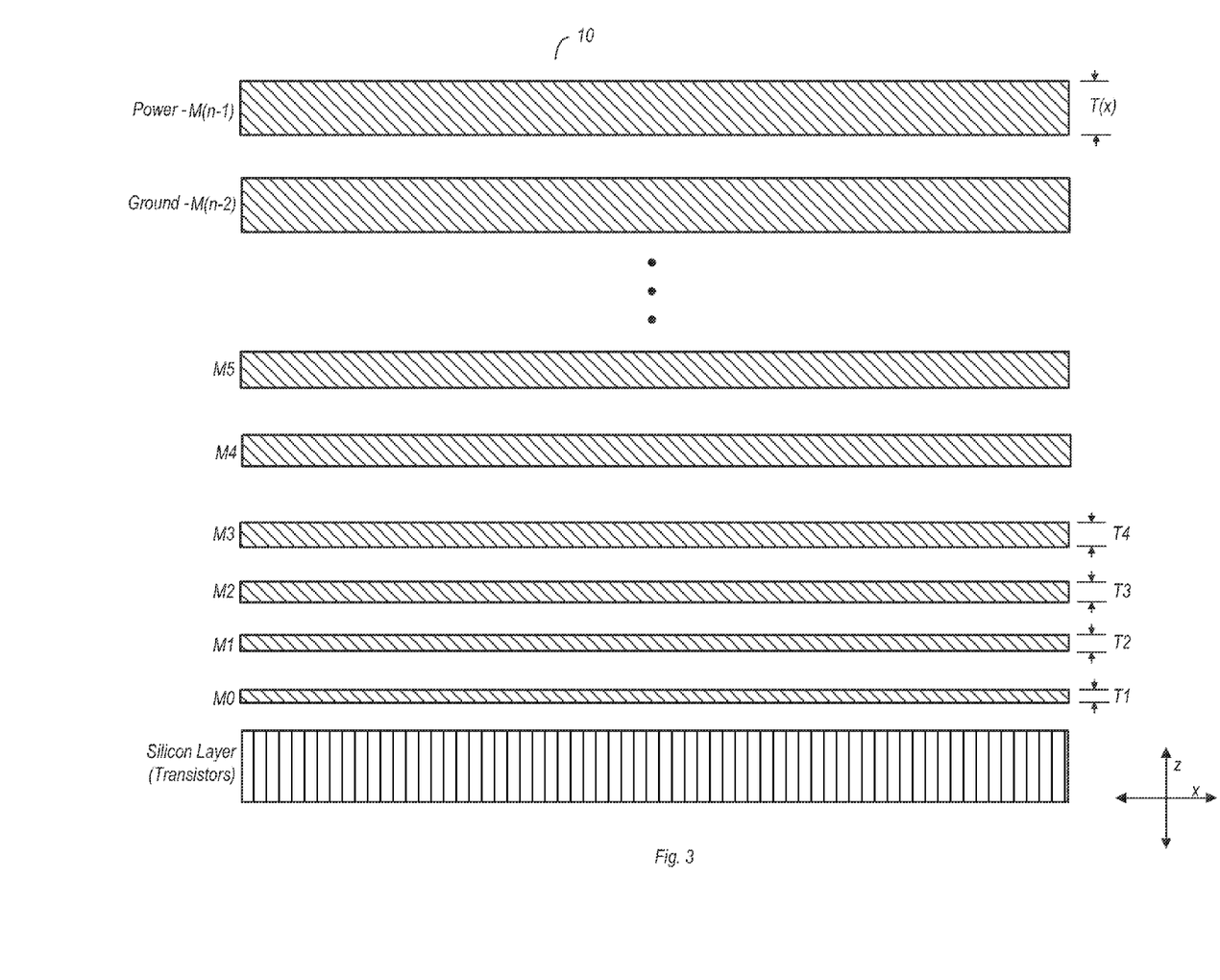
FIG. 3 is a side view of one embodiment of an IC illustrating a stack up of metal layers and a silicon layer.

FIG. 3 is a side view of one embodiment of an IC illustrating a stack up of metal layers and a silicon layer. The embodiment shown here is exemplary, and other embodiments of an IC may have a greater or lesser number of metal layers. It is noted that layers of dielectric/insulating material may be implemented between the various metal layers shown here. These dielectric/insulating layers are not shown here for the sake of simplicity.

In this particular embodiment, IC 10 includes 'n' metal layers, M0 to M(n–1). Metal layer M0 is the metal layer in this example, and thus is closest to the silicon layer in which transistors and/or other circuit elements of IC 10 may be formed. Metal layer M(n–1) is the uppermost metal layer in this embodiment, and is thus the furthest from the silicon layer. Each metal layer may extend along both the x- and y-axis, while being perpendicular to the vertical axis (i.e. the z-axis in this example).

The relative thickness of the metal layers in this embodiment increases in ascending order up the z-axis. Accordingly, M0, having a thickness of T1 is the thinnest metal layer in this embodiment. Metal layer M1 in this embodiment has a thickness of T2, which is slightly larger than T1. Similarly, metal layer M2 in this embodiment has a thickness of T3, which is slightly thicker than T2. At the top of the metal stack, metal layer M(n–1) has a thickness of T(x). It is noted that some metal layers may have a thickness that is substantially the same as others. For example, metal layer M(n–1) may have substantially the same thickness as metal layer M(n–2). However, the general pattern that higher metal layers are thicker than lower metal layers may remain largely intact for a majority of the stack in this embodiment.

The lower metal layers may be used to implement local, short distance wiring. Signal lines implemented on the lower metal layers may have a greater resistance and capacitance than their counterparts implemented on higher metal layers. The greater resistance and capacitance may be detrimental to signal propagation. However, since the distances that signals must travel is short with regard to local wiring, the resistance and capacitance of wires implemented on the lower metal layers may be tolerable. In contrast, the lower resistance and capacitance of signal lines on the higher metal layers may be more suitable for long-distance signal propagation. Accordingly, for long-distance signal lines, vias may extend from the silicon layer to various ones of the upper metal layers. The position of the vias within certain via structures, such as via structures 101 discussed above, may be dependent upon the relative position of the metal layer in the layer stack of its associated signal line. This is illustrated further in FIG. 4.

At the top of the stack, the two thickest metal layers, M(n–1) and M(n–2), may be used to implement a power plane and a ground (i.e., reference) plane. In this particular example, the power plane is implemented on metal layer M(n–1), while the ground plane is implemented on metal layer M(n–2). It is noted that this arrangement can be reversed for other embodiments. In some instances of a via structure 101, additional vias 104 may be implemented to coupled the power plane and/or the ground plane to circuitry in the silicon layer, as will be discussed in the example of FIG. 6 below.

Figure 4:
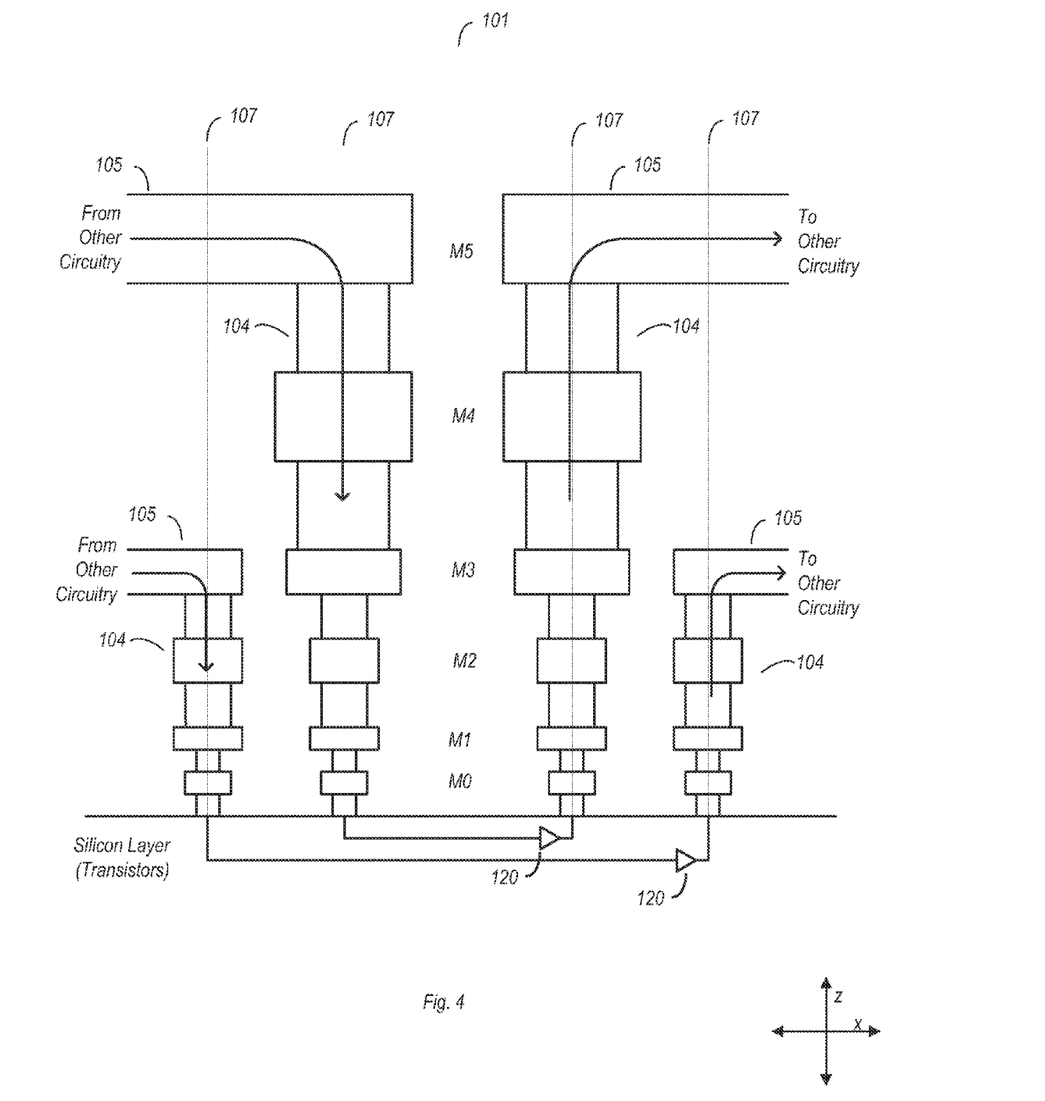
FIG. 4 is a side view of one embodiment of a via structure of an IC.

FIG. 4 is a side view of one embodiment of a via structure 101 in an embodiment of IC 10. More particularly, FIG. 4 further illustrates the geometry of via structures 101 relative to the metal layer stack. In the embodiment shown, four vias 104 are illustrated. Each of a first pair of vias in this example is coupled to corresponding ones of signal lines 105 implemented on metal layer M5. These two vias are implemented closer to the center of via structure 101. Each of a second pair of vias 104 in this particular example are coupled to corresponding ones of signal lines 105 implemented on metal layer M3, which is lower in the stack and thinner than metal layer M5. The vias 104 of this second pair are further from the center, and closer to the perimeter, of via structure 101. Although not explicitly shown, other vias 104, signal lines 105, and metal layers may be present, although only exemplary ones of each are shown here for the sake of illustration.

In the embodiment shown, each of vias 104 has a centerline 107, which coincides with a center point of that via. The centerline 107 of each via 104 may provide the reference point with respect to its position in via structure 101. Thus, the centerline 107 of each via 104 associated with a signal line 105 on a higher metal layer may be closer to the center of via structure 101 than the centerline 107 of a via 104 associated with a signal line 105 implemented on a lower metal layer.

Each of the vias 104 in the embodiment shown is coupled to an electronic circuit 120. Each electronic circuit 120 may be any type of circuitry implemented using transistors in the silicon layer. Such circuits may be a simple as a single inverter, complex as a large crossbar circuit or circuitry of a processor core, or any level of complexity therebetween (e.g., dynamic repeater circuits, etc.). It is noted that the two examples of an electronic circuit 120 shown here are not necessarily the same type of circuit.

In the embodiment shown, the centerline 107 of each via 104 extends along the z-axis. Furthermore, the centerline 107 of a given via 104 may extend between the corresponding signal line 105 and the silicon layer as a straight line, with no changes or discontinuities therebetween. This arrangement may enable signals to travel a straight path when propagating between a signal line 105 and the silicon layer. Such an arrangement may further reduce the resistance and capacitance in a long-distance signal path between two circuits, particularly when the corresponding signal line 105 is implemented as a straight line. A signal propagating through such an arrangement may travel straight up from the silicon, through a via 104, to a corresponding signal line 105, straight down the signal line 105 to a next via 104, and straight down the next via 104 to circuitry implemented in the silicon layer. This arrangement may thus allow for efficient propagation of signals over long-distance connections, which can be a very important factor in some IC designs.

It is noted in the embodiment shown that each of vias 104 extends through a number of metal layers in which it is not coupled to a signal line 105. For example, the outermost vias 104 in the embodiment shown each extend through metal layers M0, M1, and M2 without making a connection to a signal line 105 on any of these layers. Instead, each via may be coupled to a metal pad on those layers. Furthermore, each via 104 in the embodiment shown becomes wider as it ascends along the z-axis. At points where a via 104 intersects a metal layer at which it is not coupled to a corresponding signal line 105, the metal pad may be wider than the via 104 on either side. It is noted however, that this geometry is not necessarily a requirement, and thus the metal pad on a metal layer through which a via 104 passes need not be wider than the via 104 itself on either side.

It is noted that the embodiment in FIG. 4 is illustrated with respect to only the x- and z-axis, the same or similar structure may be implemented for signal lines extending along the y-axis in their respective metal layers.

Top View of Via Structure Embodiments

Figure 5:
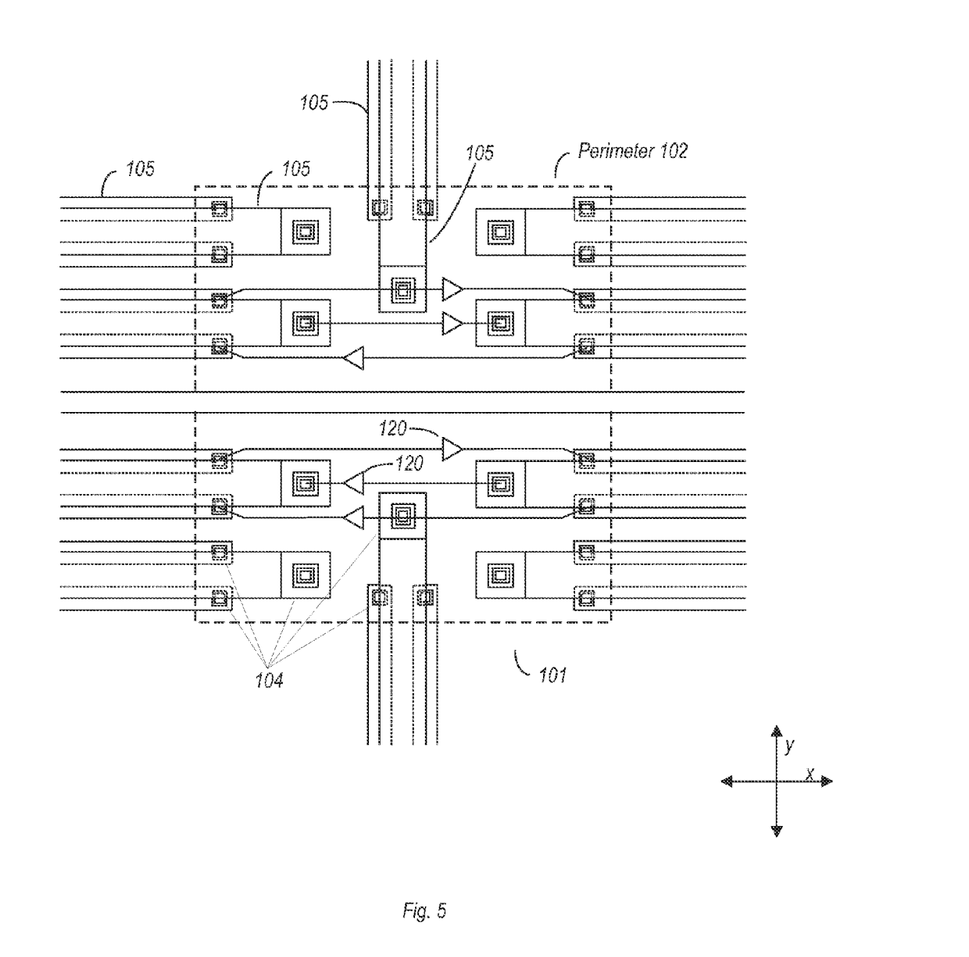
FIG. 5 is a top view of one embodiment of a via structure of an IC.
Figure 6:
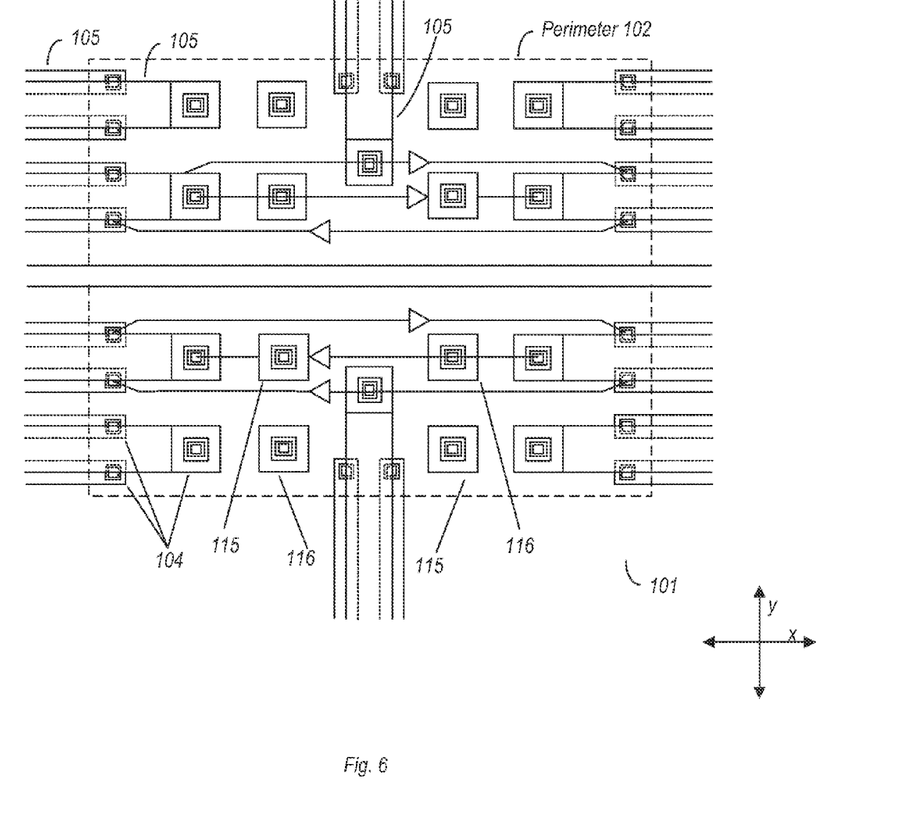
FIG. 6 is a top view of another embodiment of a via structure of an IC.

Moving now to FIG. 5, a top view of one embodiment of a via structure 101 is shown. It is noted that the embodiments shown in FIGS. 5 and 6 are exemplary, and thus the number and placement of vias within these embodiments are likewise exemplary. Furthermore, while via structure 101 has a generally square shape in this example, via structures having other shapes (e.g., rectangular or circular, etc.) are also possible and contemplated.

In this example, via structure 101 is implemented in an area defined by perimeter 102. This predefined area may determine in part where vias 104 of via structure 101 may be placed. Via structure 101 includes a number of vias 104 placed within the area defined by perimeter 102. Each of the vias 104 in the embodiment shown is coupled to a signal line 105 that is implemented on a metal layer of an IC die. The wider instances of signal lines 105 in this example may be implemented on metal layers that are higher in the stack than the narrow instances of signal lines 105 also shown herewith. The arrangement of the vias 104 in this embodiment, relative to the metal layers upon which associated signal lines 105 are implemented, may be the same as that discussed above with reference to FIGS. 2 and 4. Thus, the vias 104 associated with the narrower instances of signal lines 105 are placed closer to perimeter 102 relative to those vias associated with wider instances of signal lines 105.

Vias 104 in FIG. 6 are arranged in a similar manner. However, in this particular example of via structure 101, additional vias coupling power and ground planes to the silicon layer are also included. More particularly, vias 115 in this embodiment may be coupled to a power plane, and may thus provide a path for power to be supplied to circuitry in the silicon layer. Vias 116 in this embodiment may be coupled to a ground plane, and thus may provide a return path for circuitry in the silicon layer. In the embodiment shown, the power and ground planes may be implemented on the two thickest metal layers of the metal stack, such as the example shown in FIG. 3. Accordingly, vias 115 and 116 may be implemented closer to the center of via structure 101 than any of the other vias 104 that are associated with signal lines.

Method for Fabricating IC

Figure 7:
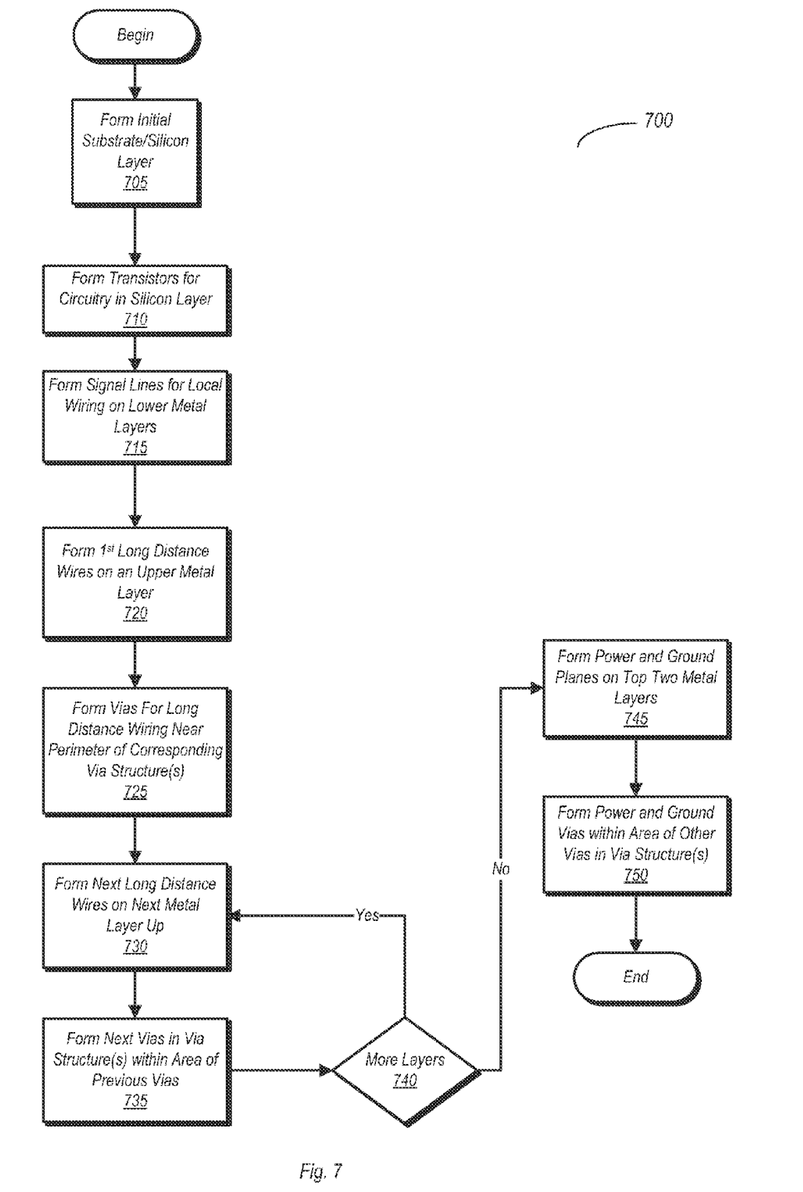
FIG. 7 is a flow diagram of one embodiment of a method for fabricating an IC.

Turning now to FIG. 7, a flow diagram of one embodiment of a method for fabricating an IC having via structures such as those discussed above. In the embodiment shown, method 700 begins with the formation of an initial substrate layer and a silicon layer (block 705). Following the initial formation of the silicon layer, transistors may be formed therein to implement circuitry of the IC (block 710). It is noted that in some embodiments, other circuit elements (e.g., resistors) may be formed in addition to the transistors.

Following the formation of the transistors, metal layers alternating with insulating/dielectric layers may be formed, beginning with a first dielectric/insulating layer formed on top of the silicon layer. Signal lines for local wiring may be formed on the lower metal layers (block 715). The local wiring may be used to form connections for circuitry within the general vicinity (e.g., to connect terminals of two different transistors in close proximity to one another).

Additional metal layers may be formed following the formation of those upon which local wiring is implemented. A first set of long-distance wires may be formed on a first upper metal layer, i.e. a first metal layer that is above any of those which local wiring is implemented (block 720). Long-distance wiring may be defined herein as wires (signal lines) used to connect circuits that are not in close proximity to each other on the IC die. For example, long-distance wires could be used to connect the circuitry of a processor core to that of a crossbar, such as in one of the exemplary buses shown in FIG. 1.

Vias of via structures (such as one of those described above) may be formed near their respective perimeters (block 725). These vias may be associated with the first set of long-distance signal wires formed, and may thus extend between the silicon layer and a lowest one of the upper metal layers. The formation of the vias may be performed in conjunction with the addition of metal layers and dielectric/insulating layers, with a portion of each via being formed with each new layer added. Within a dielectric/insulating layer, a portion of metal may be deposited where the via is to be formed, with metal connection made through pads on the metal layers, and the signal line connection being made on the metal layer of the associated wire.

After the formation of the first long-distance signal wires and their corresponding vias, additional metal layers may be added. A next set of long-distance wires may be formed on the next metal layer up (block 730). Similarly, vias coupling each of the next set of long-distance wires to circuitry in the silicon layer may also be formed within the area (i.e., closer to the center of the via structure) of the previously formed vias (block 735). Blocks 730 and 735 may be repeated if additional metal layers having long-distance signal wiring are to be added (block 740, yes).

If no additional metal layers having long-distance signal wires are to be formed (block 740, no), the power and ground planes may be formed on the top two metal layers (block 745). In some cases, the power plane may be implemented on the top metal layer, while in others, the ground plane is implemented on top. In either case, the power and ground planes may be connected, through vias, to circuitry in the silicon layer. At least some of these power and ground vias may be implemented within instances of a via structure as discussed above (block 750). Furthermore, the power and ground vias may be the innermost vias in the structure (from a top-down point of view), with their respective centers closer to the center of the overall via structure than those of vias that are associated with long-distance signal wires.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An integrated circuit comprising:
    a first plurality of signal lines on a first metal layer;
    a second plurality of signal lines on a second metal layer, wherein the second metal layer is arranged between the first metal layer and a silicon layer, wherein each of the first plurality of signal lines has a greater vertical thickness than each of the second plurality of signal lines;
    a first via structure implemented in a first predefined area, the via structure connecting each of the first plurality of signal lines and each of the second plurality of signal lines to circuitry in the silicon layer, and wherein the first via structure includes:
        a first plurality of vias each coupled to a corresponding one of the first plurality of signal lines and further coupled to circuitry in the silicon layer, wherein a center of each of the first plurality of vias extends along a vertical axis between the first metal layer and the silicon layer; and
        a second plurality of vias each coupled to a corresponding one of the second plurality of signal lines and further coupled to circuitry in the silicon layer, wherein a center of each of the second plurality of vias extends along the vertical axis between the second metal layer and the silicon layer, and wherein the center of each of the second plurality vias is closer to a perimeter of the first predefined area than any centers of the first plurality of vias.

2. The integrated circuit as recited in claim 1, wherein each of the first plurality of signal lines and each of the second plurality of signal lines are implemented as straight signal lines along a respective first axis, wherein the first axis is perpendicular to the vertical axis and parallel to a horizontal surface of the IC.

3. The integrated circuit as recited in claim 2, wherein at least one of the first plurality of signal lines and at least one of the second plurality of signal lines are each coupled to a corresponding via of a second via structure implemented in a second predefined area, wherein the second via structure includes:
    a third plurality of vias each coupled to a corresponding signal line implemented on the first metal layer and further coupled to circuitry in the silicon layer, wherein a center of each of the third plurality of vias extends along a single, vertical axis between the first metal layer and the silicon layer; and
    a fourth plurality of vias each coupled to a corresponding signal line implemented on the second metal layer and further coupled to circuitry in the silicon layer, wherein a center of each of the fourth plurality of vias extends along the single vertical axis between the second metal layer and the silicon layer, and wherein the center of each of the fourth plurality vias is closer to a perimeter of the second predefined area than any centers of the third plurality of vias.

4. The integrated circuit as recited in claim 3, further comprising a third via structure implemented in a third predefined area, wherein the third via structure includes a fifth plurality of vias coupled between the first metal layer and the silicon layer, and a sixth plurality of vias coupled between the second metal layer and the silicon layer.

5. The integrated circuit as recited in claim 4, wherein the first metal layer includes a third plurality of signal lines coupled between respective ones of the first plurality of vias and the fifth plurality of vias, and wherein the second metal layer includes a fourth plurality of signal lines coupled between respective ones of the second plurality of vias and the sixth plurality of vias.

6. The integrated circuit as recited in claim 5, wherein each of the third plurality of signal lines and each of the fourth plurality of signal lines are implemented as straight lines along a second axis, wherein the second horizontal axis is perpendicular to the first axis and the vertical axis, and wherein the second axis is parallel to the horizontal surface of the IC.

7. The integrated circuit as recited in claim 4, wherein respective centers of each of the fourth plurality of vias are closer to a perimeter of the third via structure than respective centers of each of the third plurality of vias.

8. The integrated circuit as recited in claim 1, wherein the first via structure further includes at least one power via coupled between a power plane and the silicon layer and at least one ground via coupled between a ground plane and the silicon layer, wherein respective centers of each of the first plurality of vias are closer to the perimeter of the first predefined area than respective centers of either of the at least one power via and at least one ground via.

9. The integrated circuit as recited in claim 1, wherein the first metal layer has a greater thickness than the second metal layer.

10. An integrated circuit comprising:
    a silicon layer;
    a plurality of metal layers, wherein the plurality of metal layers includes a power plane, a ground plane, a first metal layer having a first plurality of signal lines and a second metal layer having a second plurality of signal lines, wherein each of the first plurality of signal lines has a greater vertical thickness than each of the second plurality of signal lines;
    a plurality of via structures each implemented in a corresponding predefined area of the integrated circuit, wherein each of the plurality of via structures includes:
        a first plurality of vias, wherein a center of each of the first plurality of vias extends along a vertical axis between the first metal layer and the silicon layer, and wherein each of the first plurality of vias provides an electrical connection between a corresponding one of the first plurality of signal lines and circuitry implemented in the silicon layer; and
        a second plurality of vias, wherein a center of each of second plurality of vias extends along a vertical axis between the second metal layer and the silicon layer, and wherein each of the second plurality of vias provides an electrical connection between a corresponding one of the second plurality of signal lines and circuitry implemented in the silicon layer;
        wherein the center of each of the first plurality vias is closer to a center of the corresponding predefined area than the center of each of the second plurality of vias.

11. The integrated circuit as recited in claim 10, wherein one or more of the first plurality of signal lines and one or more of the second plurality of signal lines provides an electrical connection between corresponding vias of two or more of the via structures.

12. The integrated circuit as recited in claim 11, wherein each of the first plurality of signal lines and each of the second plurality of signal lines is implemented as a straight line.

13. The integrated circuit as recited in claim 12, wherein each of the first and second plurality of signal lines extends along a first axis parallel to a horizontal surface of the IC.

14. The integrated circuit as recited in claim 13, wherein the plurality of metal layers further includes a third metal layer having a third plurality of signal lines extending along a second axis perpendicular to the first axis and the vertical axis, wherein the second axis is parallel to the horizontal surface of the IC.

15. The integrated circuit as recited in claim 10, wherein:
the second metal layer is arranged between the first metal layer and the silicon layer; and
the first metal layer is arranged between the second metal layer and the power and ground planes.

16. The integrated circuit as recited in claim 15, wherein the power and ground layers are thicker than the first metal layer, and wherein the first metal layer is thicker than the second metal layer.

17. The integrated circuit as recited in claim 10, further comprising:
at least one power via coupled between the power plane and circuitry in the silicon layer, wherein the power via extends along the vertical axis between the power plane and the silicon layer; and
at least one ground via coupled between the ground plane and circuitry in the silicon layer, wherein the ground via extends along the vertical axis between the ground plane and the silicon layer;
wherein respective centers of the power and ground vias are closer to the center of the via structure than any of the first plurality of vias.

* * * * *

UNITED STATES PATENT AND TRADEMARK OFFICE
CERTIFICATE OF CORRECTION

PATENT NO.        : 8,946,905 B2                         Page 1 of 1
APPLICATION NO.   : 13/169255
DATED             : February 3, 2015
INVENTOR(S)       : Masleid It is certified that error appears in the above-identified patent and that said Letters Patent is hereby corrected as shown below:

In the Specification

In column 6, line 21, delete "coupled" and insert -- couple --, therefor.

Signed and Sealed this
Twenty-fourth Day of November, 2015

Michelle K. Lee
*Director of the United States Patent and Trademark Office*